(12) United States Patent
Bhattacharyya

(10) Patent No.: US 6,479,353 B2
(45) Date of Patent: Nov. 12, 2002

(54) REFERENCE LAYER STRUCTURE IN A MAGNETIC STORAGE CELL

(75) Inventor: Manoj Bhattacharyya, Cupertino, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/871,395

(22) Filed: May 31, 2001

(65) Prior Publication Data

US 2001/0022742 A1 Sep. 20, 2001

Related U.S. Application Data

(62) Division of application No. 09/514,961, filed on Feb. 29, 2000, now Pat. No. 6,297,983.

(51) Int. Cl.[7] .............................................. H01L 21/336
(52) U.S. Cl. ..................... 438/268; 438/142; 365/158; 365/171; 365/173; 257/422
(58) Field of Search ................................ 438/268, 142; 365/171, 173, 158; 257/422

(56) References Cited

U.S. PATENT DOCUMENTS

| | | | | | |
|---|---|---|---|---|---|
| 5,650,958 | A | * | 7/1997 | Gallagher et al. | 365/173 |
| 5,841,692 | A | * | 11/1998 | Gallagher et al. | 365/173 |
| 5,936,293 | A | * | 8/1999 | Parkin | 257/422 |
| 6,169,686 | B1 | * | 1/2001 | Brug et al. | 365/171 |
| 6,219,212 | B1 | * | 4/2001 | Gill et al. | 360/324.2 |

* cited by examiner

Primary Examiner—Richard Elms
Assistant Examiner—Pho M. Luy

(57) ABSTRACT

A magnetic storage cell includes an active layer and a reference layer which is structured to minimize disruptions to magnetization in its active layer. The reference layer is structured so that a pair of its opposing edges overlap a pair of corresponding edges of the active layer. This may be used minimize the effects of demagnetization fields on the active layer. In addition, the reference layer may be thinned at its opposing edges to control the effects of coupling fields on the active layer and balance the demagnetization field.

5 Claims, 4 Drawing Sheets

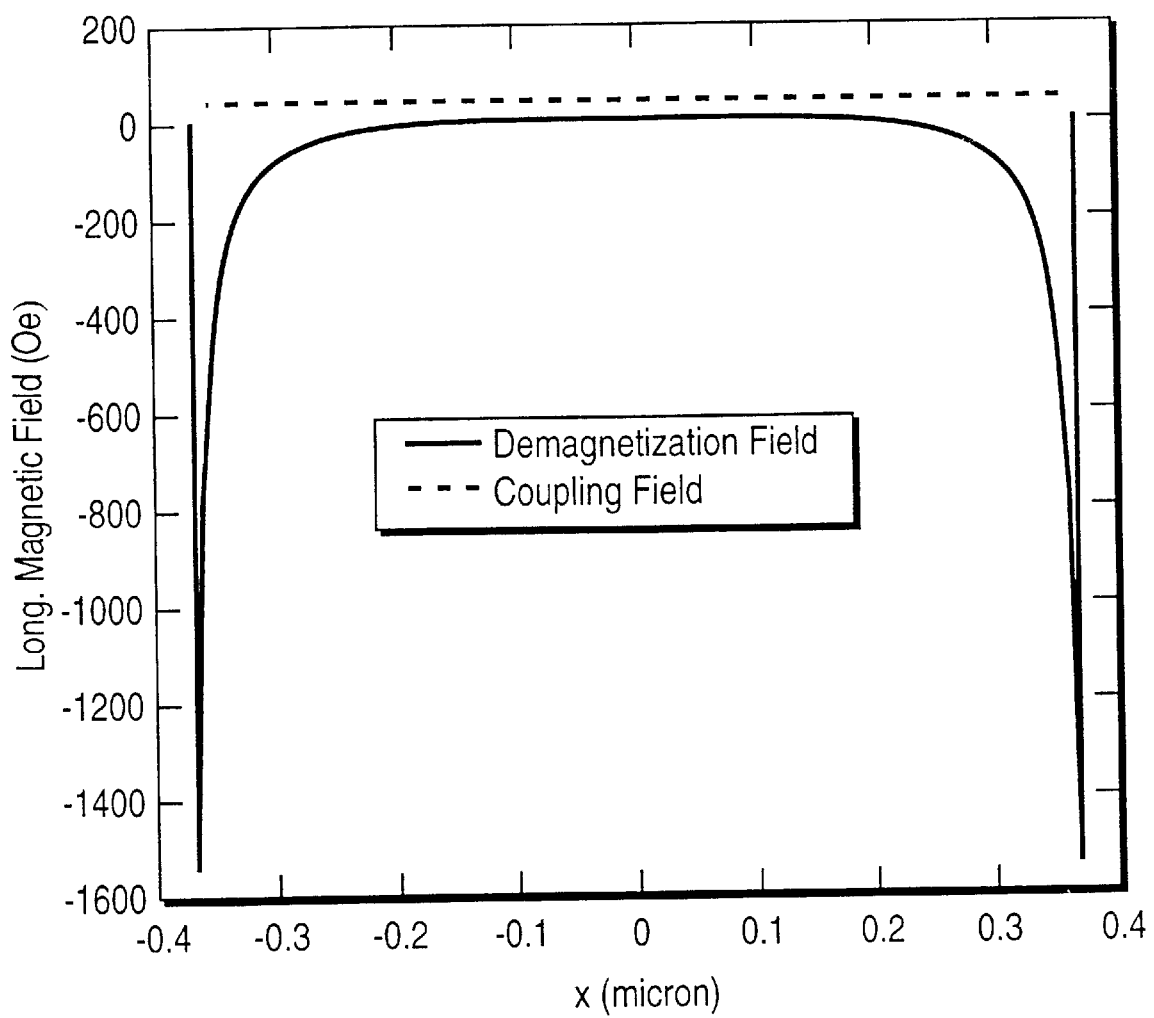

REFERENCE LAYER STRUCTURE IN A MAGNETIC STORAGE CELL

CROSS REFERENCE TO RELATED APPLICATION

This is a divisional of application Ser. No. 09/514,961 filed on Feb. 29, 2000 now U.S. Pat. No. 6,297,983.

BACKGROUND OF THE INVENTION

1. Field of Invention

The present invention pertains to the field of magnetic memories. More particularly, this invention relates to a an improved reference layer structure in a magnetic storage cell.

2. Art Background

A magnetic memory such as a magnetic random access memory (MRAM) typically includes one or more magnetic storage cells. Each magnetic storage cell usually includes an active layer and a reference layer. The active layer is usually a layer of magnetic material that stores magnetization patterns in orientations that may be altered by the application of magnetic switching fields. The reference layer is usually a layer of magnetic material in which magnetization is fixed or "pinned" in a particular direction.

The logic state of such a magnetic storage cell typically depends on its resistance to electrical current flow. Its resistance usually depends on the relative orientations of magnetization in its active and reference layers. A magnetic storage cell is typically in a low resistance state if the overall orientation of magnetization in its active layer is parallel to the orientation of magnetization in its reference layer. In contrast, a magnetic storage cell is typically in a high resistance state if the overall orientation of magnetization in its active layer is anti-parallel to the orientation of magnetization in its reference layer.

Such a magnetic storage cell is usually written to a desired logic state by applying magnetic switching fields that rotate the orientation of magnetization in its active layer. It is usually desirable that a magnetic switching field of a predictable magnitude in one direction switch a magnetic storage cell to its low resistance state and a magnetic switching field of the same predictable magnitude in the opposite direction switch the magnetic storage cell to its high resistance state. Such switching behavior may be referred to as symmetric switching characteristics. Unfortunately, a variety of effects commonly found in prior magnetic storage cells may disrupt magnetization in an active layer and create asymmetric switching characteristics.

For example, the reference layer in a typical prior magnetic storage cell generates demagnetization fields that push the magnetization in the active layer toward the anti-parallel orientation. These demagnetization fields usually increase the threshold magnitude of the magnetic switching field needed to rotate the active layer to the low resistance state and decrease the threshold magnitude of the magnetic switching field needed to rotate the active layer to the high resistance state. This typically increases the power needed to write the magnetic storage cell to the low resistance state and may cause accidental writing to the high resistance state. In extreme cases, these demagnetization fields may cause a magnetic storage cell to remain in the high resistance state regardless of the applied magnetic switching fields history.

In addition, coupling fields between the reference layer and the active layer in a prior magnetic storage cell usually push the magnetization in its active layer toward the parallel orientation. These coupling fields usually increase the power needed to write a magnetic storage cell to the high resistance state and may cause accidental writing to the low resistance state. In extreme cases, these coupling fields may cause a magnetic storage cell to remain in the low resistance state regardless of the applied magnetic switching fields history.

Moreover, the degree of disruption to the magnetization in an active layer caused by demagnetization and coupling fields may vary among the magnetic storage cells in an MRAM array. In addition, such disruptions may vary between different MRAM arrays due to variation in the patterning steps and/or deposition steps of device manufacture. Such variations typically produces uncertainty as to the behavior of individual magnetic storage cells during write operations.

SUMMARY OF THE INVENTION

A magnetic storage cell is disclosed which includes an active layer and a reference layer which is structured to minimize disruptions to magnetization in its active layer. The reference layer is structured so that a pair of its opposing edges overlap a pair of corresponding edges of the active layer. This structure may be used to minimize the effects of demagnetization fields on the active layer. In addition, the reference layer may be thinned at its opposing edges to control the effects of coupling fields on the active layer and balance the demagnetization field.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 3 is a graph that illustrates the demagnetization field and coupling field from a reference layer;

DETAILED DESCRIPTION

Figure 1:
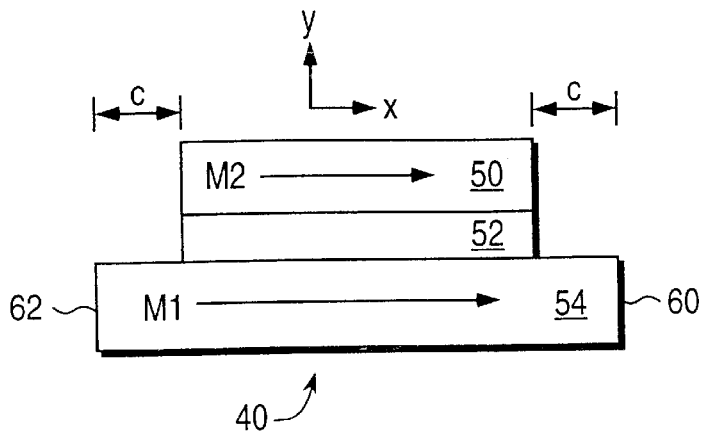
FIGS. 1–2 illustrates a magnetic storage cell which is structured to minimize disruptions to magnetization in its active layer caused by demagnetization fields from its reference layer.
Figure 2:
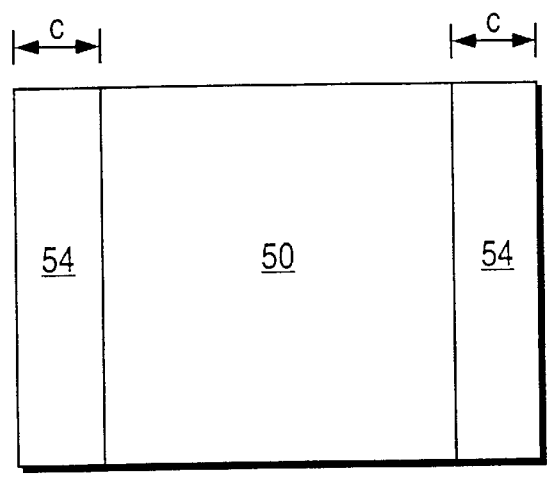

FIGS. 1–2 illustrates an arrangement for a magnetic storage cell 40 having an active layer 50 and a reference layer 54 which is structured to minimize disruptions to magnetization in the active layer 50 by demagnetization fields from the reference layer 54. FIG. 1 shows a side view and FIG. 2 shows a top view.

The active layer 50 holds an alterable magnetization state (M2) and the reference layer 54 has a pinned orientation of magnetization (M1). The length of the reference layer 54 in the x direction is greater than the length of the active layer 50 in the x direction and a pair of opposing edges 60 and 62 of the reference layer 54 overlap corresponding edges of the active layer 50. The distance of overlap of the edges 60 and 62 is substantially equal to c. The overlap distance c is preselected to minimize the effects of demagnetization fields emanating from the areas near the edges 60 and 62 on the magnetization in the active layer 50.

In this embodiment, the magnetic storage cell 40 includes a tunnel barrier 52 between the active layer 50 and the reference layer 54. The magnetic storage cell 40 in this embodiment is a spin tunneling device in which an electrical charge migrates through the tunnel barrier 52 during read operations. This electrical charge migration through the tunnel barrier 52 occurs when a read voltage is applied to the magnetic storage cell 40.

The reference layer 54 may be a ferromagnetic material such as nickel-iron or nickel-iron-cobalt to name a few examples. The tunnel barrier 52 may be an insulating material such as aluminum-oxide between about 10 and about 20 angstroms thick. The active layer 50 may be a ferromagnetic material such as nickel-iron or nickel-iron-cobalt to name a few examples. The reference layer 54 may be pinned by an antiferromagnetic material such as iron-manganese or iridium-manganese to name a few examples.

FIG. 3 is a graph that illustrates the demagnetization field and coupling field from the reference layer 54 at a small vertical distance above the surface of the reference layer 54. In the graph, values of x near −0.4 and +0.4 correspond to regions near the edges 60 and 62 of the reference layer 54 whereas values of x near 0 correspond to an interior region of the reference layer 54. The graphs shows that the demagnetization field is strongest near the edges 60 and 62 of the reference layer 54. The overlap distance c is selected so that the high demagnetization field near the edges 60 and 62 has reduced effect on the active layer 50 in comparison to prior storage cells in which the active and reference layers have substantially the same length.

Figure 4:
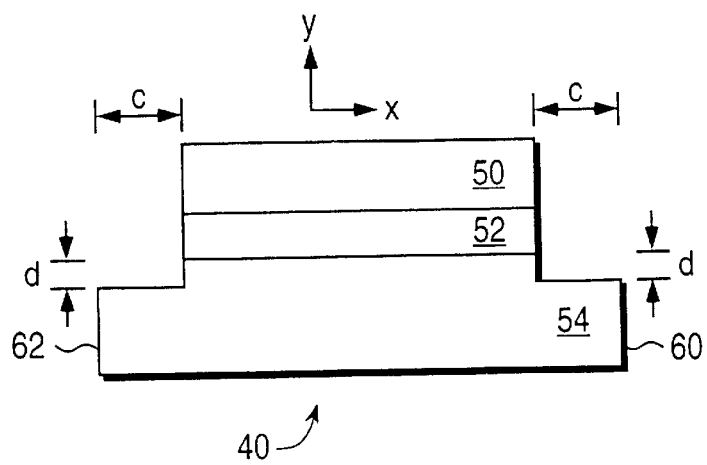
FIG. 4 illustrates a magnetic storage cell which is structured to balance the effects of coupling fields and demagnetization fields from its reference layer that act on its active layer.

FIG. 4 illustrates an arrangement for the magnetic storage cell 40 in which the reference layer 54 is structured to balance the effects of coupling fields and demagnetization fields from the reference layer 54 that act on the active layer 50. The edges 60 and 62 of the reference layer 54 overlap corresponding edges of the active layer 50 by a distance substantially equal to c. In addition, the reference layer 54 is thinner by a distance in the y direction substantially equal to d in the areas of the reference layer 54 that overlap outside of the active layer 50.

The magnitude of the coupling field from the reference layer 54 that acts on the active layer 50 is often a function of the thickness of the tunnel barrier 52. In this arrangement, the distances c and d are chosen so as to balance the demagnetization field and the coupling field acting on the active layer 50. For a larger value of c, a large value of d is appropriate to achieve this balance, whereas for a smaller value of c, a smaller value of d is appropriate to achieve this balance. In other words, there are two extra parameters that are controllable to obtain a balanced data film. This is in contrast to prior cells in which the data and reference films are made of the same width and the distance d is always the same as the entire reference film thickness.

This ability to control the effects of demagnetization fields and coupling fields leaves a designer free to choose thicknesses for the layers 50 and 54 that will yield relatively high magneto-resistance in the magnetic storage cell 40. A designer does not have to reduce the thicknesses of the reference layer, which reduces magneto-resistance, as is common in the prior art to reduce the disruptions to the active layer. A high magneto-resistance is desirable because it increases the read signal from the magnetic storage cell 40.

In example embodiments, the thicknesses of the active layer 50 and the reference layer 54 can range between about 2 and about 20 nanometers. The distance c can range from 0.01 to 0.5 microns and the distance d can range from 0 to about 20 nanometers.

Figure 5:
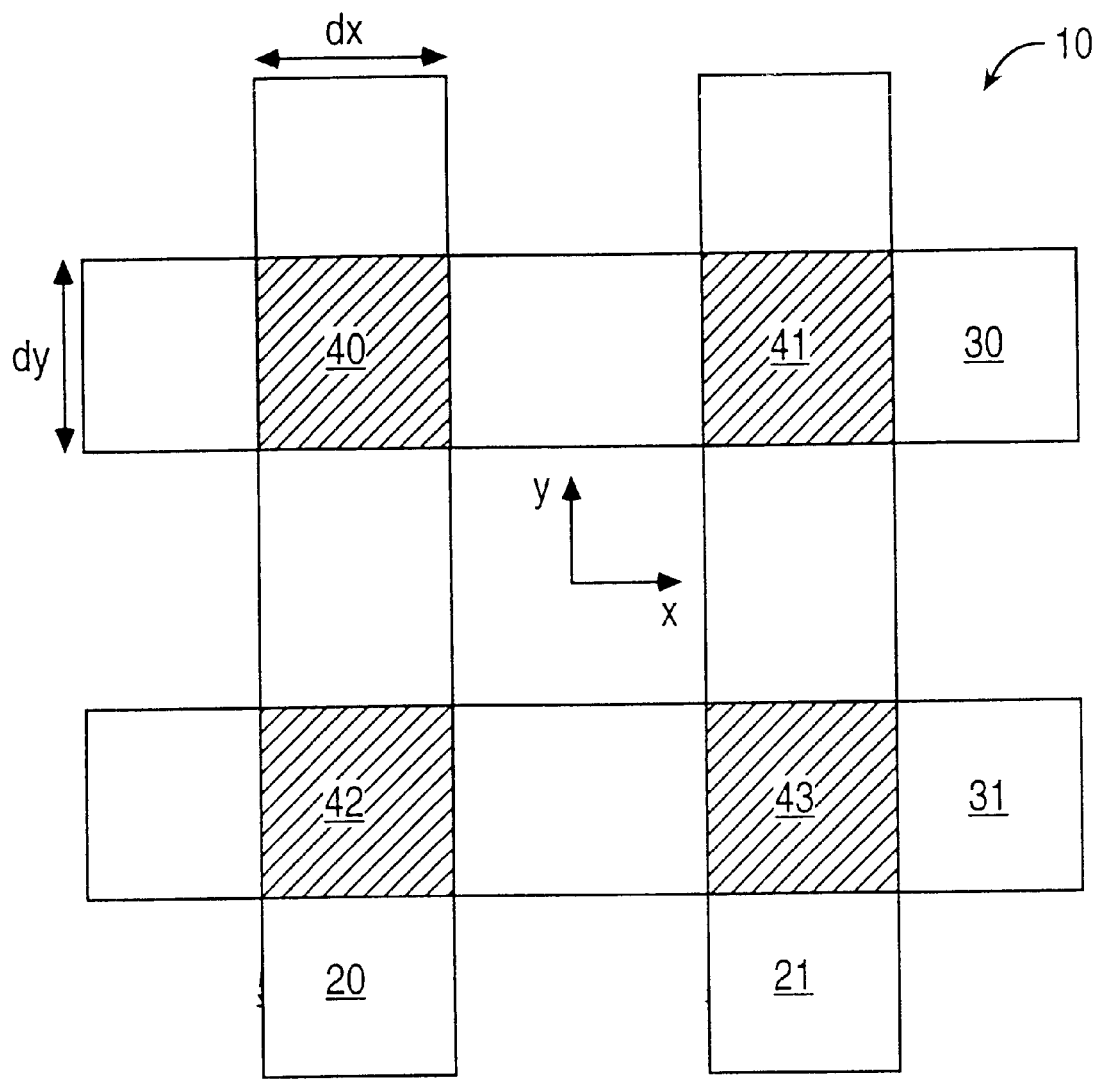
FIG. 5 is a top view of a magnetic memory which incorporates the present teachings.

FIG. 5 is a top view of a magnetic memory 10, an MRAM, which incorporates the present teachings. The magnetic memory 10 includes an array of magnetic storage cells including the magnetic storage cell 40 along with additional magnetic storage cells 41–43 each formed with structures described above that minimize disruptions to active layers in the magnetic storage cells 41–43. The magnetic memory 10 includes an arrangement of conductors 20–21 and 30–31 that enable read and write access to the magnetic storage cells 40–43.

In one embodiment, the dimensions dx and dy of the magnetic storage cells 40–43 are selected to be substantially equal and form a square shape. The square shape enhances the density that may be obtained in an MRAM in comparison to that which may be obtained when using rectangular storage cells. This is so because for a given minimum feature size more square magnetic storage cells may be formed on a given substrate area than rectangular magnetic storage cells. In other embodiments, rectangular shapes may be used.

Figure 6A:
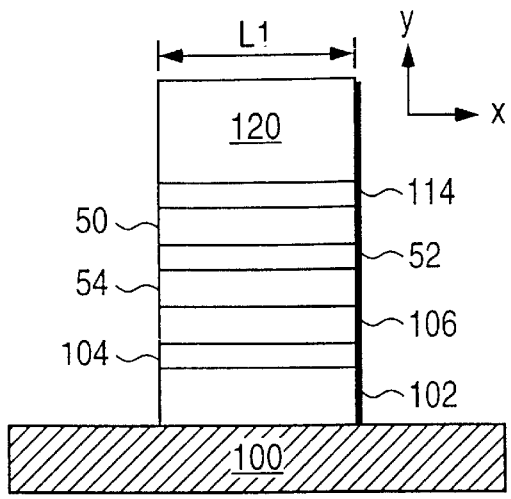
FIGS. 6a–6d show example process steps involved in forming storage cells according to the present teachings.

FIGS. 6a–6d show example process steps involved in forming storage cells according to the present teachings. FIG. 6a shows a materials stack deposited on a substrate 100 and patterned using a pattern mask 120 and an ion milling step. The ion milling step removes areas of the materials stack outside of the pattern mask 120 down to the substrate 100. The materials stack is one typically used for forming spin tunneling storage cells and includes a conductor layer 102, a ferromagnetic seed layer 104, an anti-ferromagnetic pinning layer 106, a bottom ferromagnetic layer that provides the reference layer 54, a tunnel barrier layer that provides the tunnel barrier 52, a top ferromagnetic layer that provides the active layer 50, and a capping layer 114.

Figure 6B:
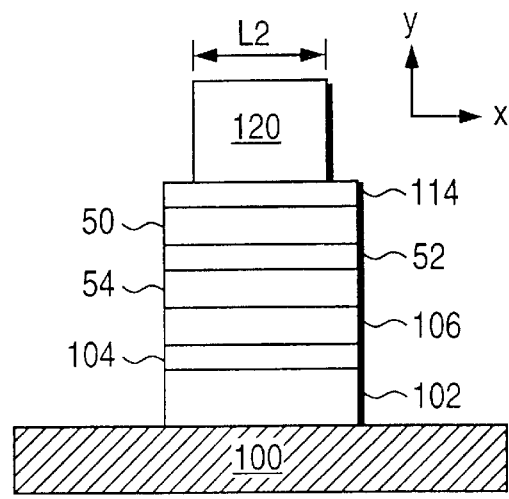

The materials stack after ion milling has a length in the x direction of L1. The pattern mask 120 is then shrunk down to a length L2=L1−2c as shown in FIG. 6b. The pattern mask 120 is shrunk using a reactive ion etch in which oxygen reacts with carbon in the pattern mask 120 to form $CO_2$ which is then removed. The time spent on the reactive ion etch is selected to control the amount by which the pattern mask 120 is shrunk, i.e. to control the distance c.

Figure 6C:
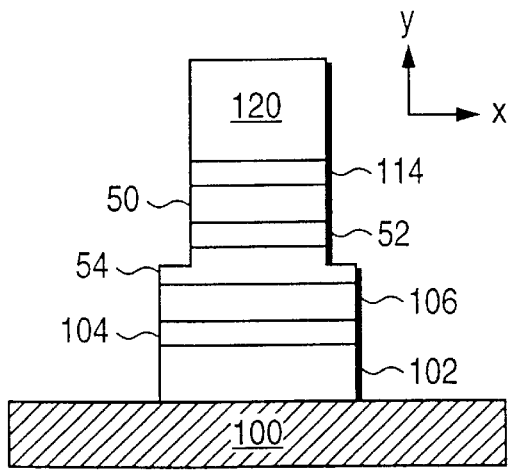

The materials stack then undergoes an ion milling step to remove material down into the reference layer 54 and thin the reference layer 54 by a distance d in the edge areas of the reference layer 54. FIG. 6c shows the result of the ion milling step. The time spent in ion milling is selected to the control the distance d by which the reference layer 54 is thinned in its edge regions.

Figure 6D:
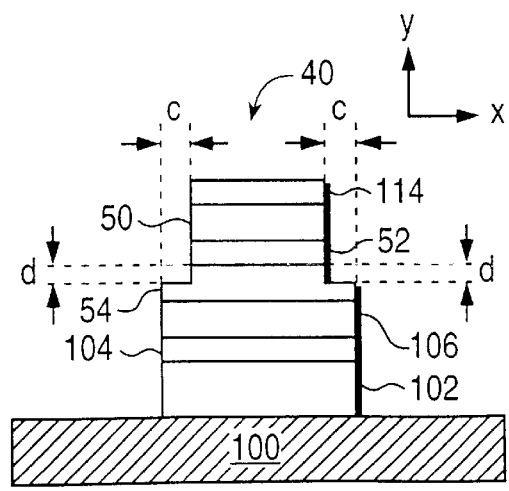

The pattern mask 120 is then removed resulting in the structure shown in FIG. 6d for the magnetic storage cell 40. A top conductor can then be formed.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method for constructing a magnetic storage cell, comprising the steps of:

forming an active layer and a reference layer for the magnetic storage cell;

milling the active and reference layers to minimize disruptions to magnetization in the active layer such that the reference layer has a pair of opposing edges that overlap a pair of opposing edges of the active layer.

2. The method of claim 1, wherein the step of milling the active and reference layers includes the step of selecting a distance by which the opposing edges of the reference layer overlap the opposing edges of the active layer to control a demagnetization field from the reference layer that acts on the active layer.

3. The method of claim 2, wherein the step of milling the active and reference layers comprises the step of milling the active and reference layers such that the reference layer has a first thickness at the opposing edges of the reference layer and a second thickness at an interior region such that the first thickness is less than the second thickness.

4. The method of claim 3, wherein the step of milling the active and reference layers includes the step of selecting an amount by which the first thickness is less than the second thickness to control a coupling field from the reference layer that acts on the active layer.

5. A method for constructing a magnetic storage cell, comprising the steps of:

forming an active layer and a reference layer for the magnetic storage cell;

milling the active and reference layers to minimize disruptions to magnetization in the active layer, wherein the step of milling includes the steps of, milling the active and reference layers such that the reference layer has a pair of opposing edges that overlap a pair of opposing edges of the active layer, selecting a distance by which the opposing edges of the reference layer overlap the opposing edges of the active layer to control a demagnetization field from the reference layer that acts on the active layer, milling the active and reference layers such that the reference layer has a first thickness at the opposing edges of the reference layer and a second thickness at an interior region such that the first thickness is less than the second thickness, selecting an amount by which the first thickness is less than the second thickness to control a coupling field from the reference layer that acts on the active layer, and selecting the amount by which the first thickness is less than the second thickness and the distance by which the opposing edges overlap to balance the demagnetization and coupling fields that act on the active layer.

* * * * *